US010886193B2

(12) United States Patent
Bunyan

(10) Patent No.: US 10,886,193 B2
(45) Date of Patent: Jan. 5, 2021

(54) THERMAL INTERFACE MATERIAL

(71) Applicant: Parker-Hannifin Corporation, Cleveland, OH (US)

(72) Inventor: Michael Bunyan, Newburyport, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 198 days.

(21) Appl. No.: 16/088,260

(22) PCT Filed: Mar. 28, 2017

(86) PCT No.: PCT/US2017/024456
§ 371 (c)(1),
(2) Date: Sep. 25, 2018

(87) PCT Pub. No.: WO2017/172703
PCT Pub. Date: Oct. 5, 2017

(65) Prior Publication Data
US 2020/0258808 A1    Aug. 13, 2020

Related U.S. Application Data

(60) Provisional application No. 62/315,326, filed on Mar. 30, 2016.

(51) Int. Cl.
*H01L 23/34* (2006.01)
*H01L 21/00* (2006.01)
(Continued)

(52) U.S. Cl.
CPC .......... *H01L 23/3735* (2013.01); *H01L 23/34* (2013.01); *H01L 23/3672* (2013.01); *H01L 23/427* (2013.01)

(58) Field of Classification Search
CPC ............... H01L 23/3735; H01L 23/427; H01L 23/3672; H01L 23/34
See application file for complete search history.

(56) References Cited

U.S. PATENT DOCUMENTS 6,835,453 B2    12/2004  Greenwood et al.
8,081,468 B2 *  12/2011  Hill ................... H05K 7/20472
                                                    165/185
(Continued)

FOREIGN PATENT DOCUMENTS

EP          134353 A1      10/2003
WO      2015043947 A1       4/2015
WO      2015044773 A2       4/2015

OTHER PUBLICATIONS

The International Search Report and the Written Opinion of the International Search Authority for corresponding International Application No. PCT/US2017/024456 dated Jul. 18, 2017.

*Primary Examiner* — Alonzo Chambliss
(74) *Attorney, Agent, or Firm* — Renner, Otto, Boisselle & Sklar, LLP

(57) ABSTRACT

Thermal thermally conductive interfaces are used in electronic devices for heat transfer between, for example, the mating heat transfer surfaces of a heat-generating, electronic component, such as an integrated circuit (IC) chip, and a thermal dissipation member, such as a heat sink or spreader, for the conductive cooling of the electronic component. The thermally conductive interface includes a heat spreading material formed of a flexible, lamellar graphite material having a plurality of coarse perforations therein; and a coating of a thermally-conductive phase change material joined to the surface of the graphite material.

15 Claims, 3 Drawing Sheets

(51) Int. Cl.
   *H01L 23/373*   (2006.01)
   *H01L 23/427*   (2006.01)
   *H01L 23/367*   (2006.01)

(56) References Cited

U.S. PATENT DOCUMENTS

| | | |
|---|---|---|
| 8,837,151 B2 | 9/2014 | Hill et al. |
| 8,963,323 B2 | 2/2015 | Kempers et al. |
| 9,222,735 B2 * | 12/2015 | Hill .................... H05K 7/20472 |
| 2009/0027857 A1 | 1/2009 | Dean et al. |
| 2010/0321895 A1 | 12/2010 | Hill et al. |
| 2010/0321897 A1 * | 12/2010 | Hill ........................ B32B 15/08 |
| | | 361/720 |
| 2012/0061135 A1 | 3/2012 | Hill et al. |

* cited by examiner

THERMAL INTERFACE MATERIAL

This application is a national phase of International Application No. PCT/US2017/024456 filed on Mar. 28, 2017 and published in the English language, and claims priority to U.S. Provisional Application No. 62/315,326 filed on Mar. 30, 2016, which are incorporated herein by reference.

FIELD OF THE INVENTION

The present invention relates broadly to thermal management materials for electronic devices. Such materials commonly are used as heat transfer interfaces between, for example, the mating heat transfer surfaces of a heat-generating, electronic component, such as an integrated circuit (IC) chip, and a thermal dissipation member, such as a heat sink or spreader, for the conductive cooling of the electronic component. More particularly, the present invention relates to a thermally-conductive interface that is formed of a flexible, conformable sheet of graphite material.

BACKGROUND

Circuit designs for modern electronic devices have become increasingly complex. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with the challenge of how to dissipate the heat which is ohmically or otherwise generated by these components. It is well known that many electronic components, and especially power semiconductor components such as transistors and microprocessors, are more prone to failure or malfunction at high temperatures. Thus, the ability to dissipate heat often is a limiting factor on the performance of the component.

Heat dissipation may be effected by the direct mounting of the electronic component to a thermal dissipation member such as a "cold plate" or other heat sink or spreader. The dissipation member may be a dedicated, thermally-conductive ceramic or metal plate or finned structure, or simply the chassis or circuit board of the device. However, beyond the normal temperature gradients between the electronic component and the dissipation member, an appreciable temperature gradient is developed as a thermal interfacial impedance or contact resistance at the interface between the bodies.

The thermal interface surfaces of the component and heat sink typically are irregular, either on a gross or a microscopic scale. When the interfaces surfaces are mated, pockets or void spaces are developed therebetween in which air may become entrapped. These pockets reduce the overall surface area contact within the interface which, in turn, reduces the heat transfer area and the overall efficiency of the heat transfer through the interface. To improve the heat transfer efficiency through the interface, a thermal interface material may be used to fill the gap between the heat sink and electronic component to fill in any surface irregularities and eliminate air pockets. The thermal interface material may be a pad or other layer of a thermally-conductive, electrically-insulating material.

SUMMARY

The present invention is directed to a heat transfer material that is interposable between the thermal interfaces of a heat-generating, electronic component and a thermal dissipation member.

In a first aspect of the invention there is provided a thermally conductive interface for interposition between a heat-generating electronic component having an operating temperature range above normal room temperature and a first heat transfer surface disposable in thermal adjacency with a second heat transfer surface of a thermal dissipation member, said interface including: a heat spreading material formed of a flexible, lamellar graphite material of intercalated graphite flake in the form of a graphite sheet having a first major surface and a second major surface, the graphite sheet having a plurality of perforations therein; and a coating of a thermally-conductive phase change material on at least one of the first and second major surfaces of the graphite sheet, the coating having a thickness of less than 0.5 mil.

The phase change material may include an admixture of a polymeric component and one or more thermally conductive fillers.

The one or more thermally conductive fillers may be chosen from among boron nitride, titanium diboride, aluminum nitride, silicon carbide, graphite, metals, metals oxide, and mixtures thereof.

The polymeric component may include one or more resins, one or more waxes, or a blend of one or more waxes and one or more resins. The resins or waxes may be selected from among thermoplastics, paraffinic waxes and blends thereof.

In one embodiment, the thermal dissipation member is a heat sink or a circuit board.

In another aspect of the invention there is provided a thermal management assembly that includes: a first heat transfer surface; a second heat transfer surface opposing the first heat transfer surface; and a thermally conductive interface interposed intermediate the first heat transfer surface and second heat transfer surface to provide a thermally conductive pathway therebetween. The interface has a first interface surface disposed in heat transfer contact with the first heat transfer surface and an opposing second interface surface disposed in heat transfer contact with said second heat transfer surface. The interface includes: a heat spreading material formed of a flexible, lamellar graphite material of intercalated graphite flake in the form of a graphite sheet having a first interior surface and a first exterior surface defining the first interface surface of said interface, the graphite sheet having a plurality of perforations therein; and a coating of a thermally-conductive phase change material having a second interior surface joined to the first interior surface of the of the graphite sheet, the coating having a thickness of less than 0.5 mil.

In another aspect of the invention there is provided a method of conductively cooling a heat-generating electronic component having an operating temperature range above normal room temperature and a first heat transfer surface disposable in thermal adjacency with a second heat transfer surface of a thermal dissipation member to define an interface therebetween, the method including the steps of: (a) providing a thermally conductive flexible material to substantially fill the interface, the flexible material including a flexible, lamellar graphite material of intercalated graphite flake in the form of a graphite sheet having a first major surface and a second major surface, the graphite sheet having a plurality of perforations therein; and a coating of a thermally-conductive phase change material on at least one of the first and second major surfaces of the graphite sheet, the coating having a thickness of less than 0.5 mil, wherein the phase change material has a transition temperature from a first phase to a second phase within the operating temperature range of said electronic component, and the material including at least one resin or wax component blended with at least one thermally-conductive filler; (b) applying said flexible material to one of the heat transfer surfaces; (c) disposing the heat transfer surfaces in thermal adjacency to define the interface; and (d) energizing said electronic component effective to heat the coating to a temperature which is above the phase transition temperature.

DETAILED DESCRIPTION

The present invention is directed to a thermal interface for a thermal management assembly involving, for example, a heat source such as an electronic chip or other heat-generating component and a thermal dissipation member such as a heat sink or spreader disposable in thermal adjacency with the electronic component for the conduction of heat therebetween. More particularly, the invention is directed to an interface, such as in the form of a sheet or pad, which is conformable to the interfacing surface of the electronic component and the heat sink or spreader to provide a low thermal impedance across the assembly, but which also is cleanly releasable from the electronic component for rework, repositioning, or other disassembly.

Figure 1:
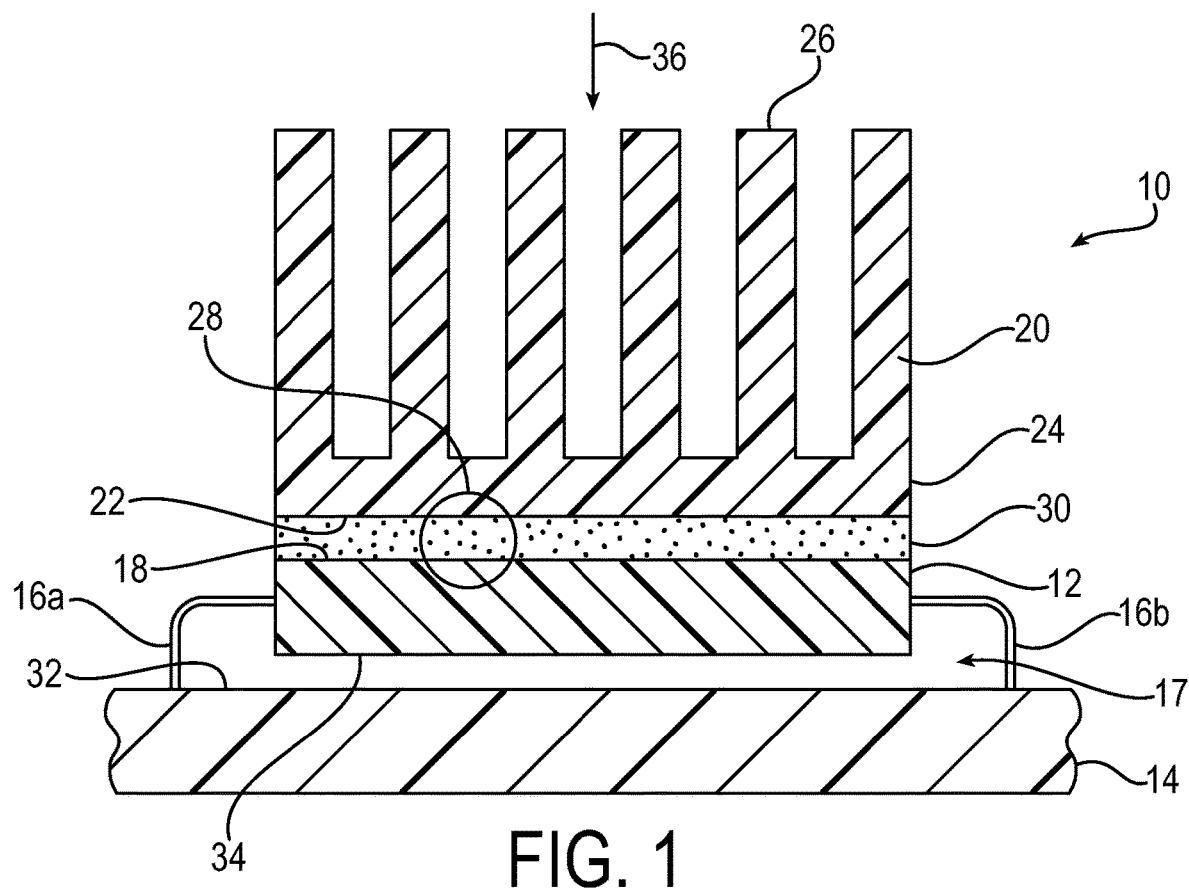
FIG. 1 is a fragmentary, cross-sectional view of an electrical assembly wherein a heat generating electronic component thereof is conductively cooled in accordance with the present invention via the provision of an interlayer of a thermally-conductive material within the thermal interface between the heat transfer surfaces of the component and an associated thermal dissipation member.

Referring to the drawings wherein corresponding reference characters indicate corresponding elements throughout the figures, shown generally at 10 in FIG. 1 is an exemplary electrical assembly which includes a heat-generating digital or analog electronic component 12, supported on an associated printed circuit board (PCB) or other substrate 14. Electrical component 12 may be an integrated microchip, microprocessor, transistor, or other semiconductor, or an ohmic or other heat-generating subassembly such as a diode, relay, resistor, transformer, amplifier diac, or capacitor. Typically, component 12 will have an operating temperature range above normal room temperature, i.e., 21-23° C. For example, the operating temperature of component 12 may be in the range of about 60-80° C. For the electrical connection of component 12 to board 14, a pair of leads or pins, 16a and 16b, are provided as extending from either end of component 12 into a soldered or other connection with board 14. Leads 16 additionally may support component 12 above board 14 to define a gap, represented at 17, of about 3 mils (75 microns) therebetween. Alternatively, component 12 may be received directly on board 14.

As supported on board 14, electronic component 12 presents a first heat transfer surface 18, which is disposable in a thermal, spaced-apart adjacency with a corresponding second heat transfer surface 22, of an associated thermal dissipation member 20. Dissipation member 20 is constructed of a metal material or the like having a heat capacity relative to that of component 12 to be effective is dissipating thermal energy conducted or otherwise transferred therefrom. For purposes of the present illustration, thermal dissipation member 20 is shown as a heat sink having a generally planar base portion 24, from which extends a plurality of cooling fins, one of which is referenced at 26. With assembly 10 configured as shown, fins 26 assist in the convective cooling of component 12, but alternatively may be received within an associated cold plate or the like, not shown, for further conductive dissipation of the thermal energy transferred from component 12.

The disposition of first heat transfer surface 18 of electronic component 12 in thermal adjacency with second heat transfer surface 22 of dissipation member 20 defines a thermal interface represented at 28, therebetween. A thermally-conductive interlayer 30, is interposed within interface 28 between heat transfer surfaces 18 and 22 for providing a conductive path therethrough for the transfer of thermal energy from component 12 to dissipation member 20. Such path may be employed without or in conjunction with convective air circulation for effecting the cooling of component 12 and ensuring that the operating temperature thereof is maintained below specified limits.

Although thermal dissipation member 20 is shown to be a separate heat sink member, board 14 itself may be used for such purpose by alternatively interposing interlayer 30 between surface 32 thereof and corresponding surface 34 of electronic component 12. In either arrangement, a clip, spring, or clamp or the like (not shown) additionally may be provided for applying an external force, represented at 36, of from about 1-2 lbsf for improving the interface area contact between interlayer 30 and surfaces 18 and 22 or 32 and 34.

The thermally conductive interlayer 30 includes a flexible, lamellar graphite material. The flexible, lamellar graphite material may be provided as formed of intercalated graphite flake, which is rolled, calendared, molded, or otherwise compressed to form a sheet without the use of a binder. Such materials advantageously exhibit thermal stability, chemical resistance, low creep relaxation, and a relatively a high thermal conductivity in the "z" or "through sheet" direction. The thickness of the graphite sheet may be in the range of between about 5-20 mils (125-500 μm). In exemplary embodiments, the thickness of the graphite sheet is about 5 mils (127 μm), or about 10 mils (254 μm), or about 20 mils (508 μm).

As used herein, the term "consisting essentially of" as it refers to the lamellar graphite material means that the lamellar graphite material does not contain a binder.

Figure 2:
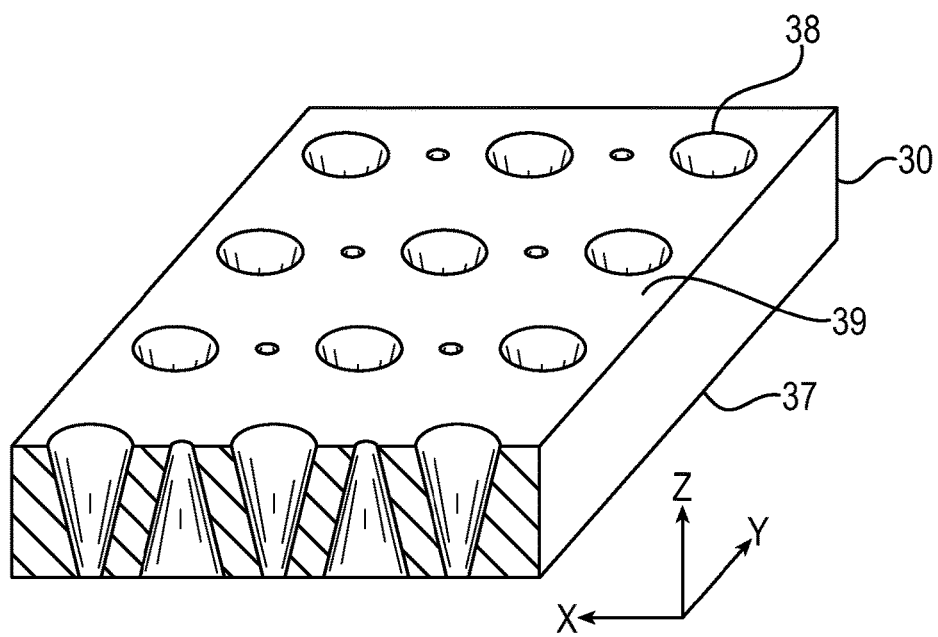
FIG. 2 is a perspective view of a representative thermal interface pad in accordance with the present invention.

Referring to FIG. 2, the interlayer 30 includes a first major surface 37 and an opposing second major surface 39, and a plurality of coarse perforations 38 that do not punch out chads/voids through the flexible graphite sheet. The perforations may be aligned in an array of rows and columns, and may be formed by compressing the graphite sheet between top and bottom plates of an embossing punch or die. The perforations do not form through holes in the flexible graphite sheet. By "coarse" it is meant that the dimensions of perforations are not on the micron scale, e.g., less than 100 μm. Rather, the diameter or width of the perforations is in the range of about 10 mils (0.25 mm) to about 50 mils (1.27 mm).

Figure 3:
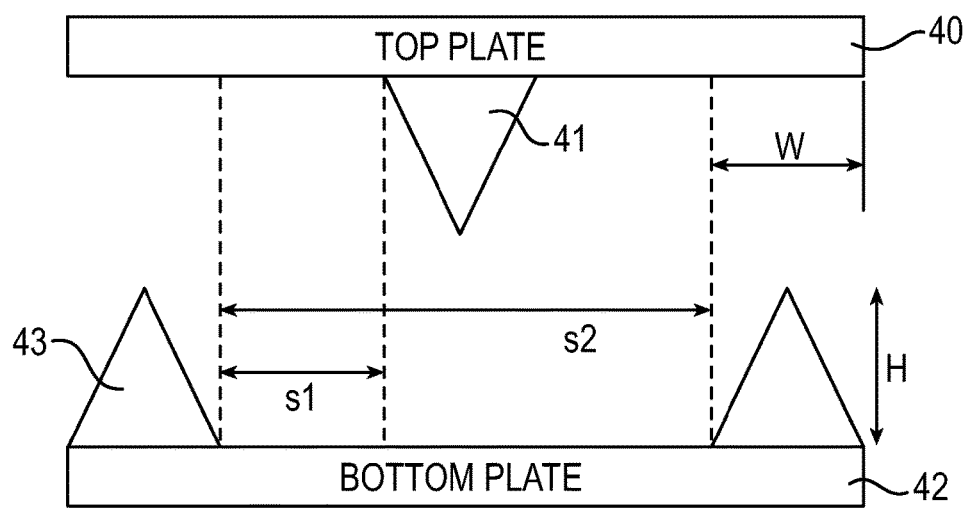
FIG. 3 is an exemplary schematic representation of two embossing plates for perforating the thermally conductive material.

Referring to FIG. 3, in one embodiment, interlayer 30 is formed by placing the coated flexible graphite sheet between a top and bottom die, 40 and 42 respectively, each die having a plurality of spaced apart projections 41 and 43, respectively. The projections may be conical in shape or pyramidal in shape, for example. In one embodiment, the height of the projections, h, may be about 0.05 inch, and the diameter or width of the projections, w, may be about 0.03 inch. On each die, the adjacent projections may be spaced apart by a distance 52, measured from the base of the nearest projection, of about 0.09 inch. Each projection may be spaced apart from the nearest opposing projection by a distance si, measured from the base of the projections, of about 0.03 inch. The dimensions of the projections may be varied, depending on the thickness of the graphite sheet and the specific application in which the thermally conductive interlayer is to be used.

The projections deform the flexible graphite sheet by displacing the graphite material, thereby creating surface deformities on both surfaces of the graphite sheet. These deformities increase the surface area of the graphite sheet, which facilitates heat transfer in the x-y plane. In addition, the perforations increase the flexibility of the graphite sheet. Also, the coarse perforations increase the thickness and conformability of the sheet between opposing substrates resulting in increased contact area and thermal transfer. This coarse texture allows the sheet to conform in the z-axis at lower pressures (i.e., 25-50 psi) as opposed to typical graphite dry films that require higher pressures (i.e., 100-300 psi) in applications.

Figure 4:
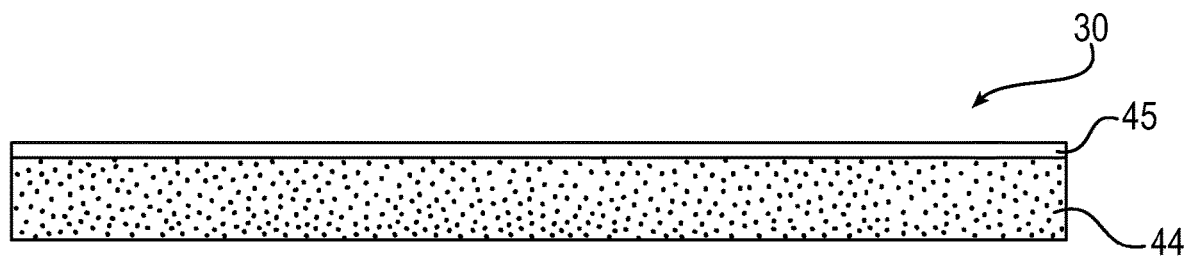
FIG. 4 is a cross-sectional view of a representative thermal interface pad prior to perforation, wherein the pad includes a thin coating of a thermally conductive material.

Referring to FIG. 4, one or both surfaces of the graphite sheet 44 are coated with a thin film 45 of a thermally conductive material such as a grease or wax or phase change material (PCM) prior to the graphite sheet being perforated. Such materials usually are semi-liquid or solid at normal room temperature, i.e., about 25° C., but liquefy or soften at elevated temperatures within the operating temperature range of the electronic component to provide a low thermal impedance contact. The thin PCM film decreases the contact resistance at the heat transfer surfaces 18 and 22. In one embodiment, the thickness of the coating is less than about 0.5 mil (0.0005 inch).

"Melting temperature" is used herein in its broadest sense, and as interchangeable with "melting point," "softening temperature," and "softening point" to indicate a transition from a form-stable crystalline or glassy solid phase to a flowable liquid, semi-liquid, or otherwise viscous, thixotropic phase or melt which may be generally characterized as exhibiting intermolecular chain rotation. In this regard, the specified components typically will exhibit the stated softening or melting points as determined by means of differential scanning calorimetry (DSC) or differential thermal analysis (DTA). For amorphous materials not having a clearly defined melting peak, the term melting temperature also is used interchangeably with glass transition point at which the materials may be characterized as exhibiting intramolecular chain rotation.

The thermally conductive grease may be oil-based, and more particularly based on a mineral or hydrocarbon oil, a synthetic oil such as a glyceride or a silicone oil, or a blend of one or more of the aforementioned. The thermally conductive grease may be compounded with a thermally conductive particulate filler, such as aluminum oxide, magnesium oxide, zinc oxide, boron nitride and aluminum nitride.

The PCM may be formulated as an admixture of a polymeric component and one or more thermally conductive fillers. The polymeric component may be a resin such as a pressure-sensitive adhesive (PSA) or thermoplastic hot-melt, a paraffinic or other wax, a blend of one or more resins or one or more waxes, or a blend of one or more resins and one or more waxes. The polymeric component may be a resin such as an acrylic, acrylamide, or copolymer blend thereof, or a polyolefin, polyimide, polycarbonate, polyester, ethylene vinyl acetate, polyvinyl acetate, polyimide or copolymer or blend thereof. The polymeric component may be an α-olefinic thermoplastic, which may be characterized as a "low melt" composition. For example, the α-olefinic thermoplastic may have a melting temperature of from about 50° C. to about 60° C. A representative material of this type is an amorphous polymer of a C10 or higher alkene which is marketed commercially by Petrolite Corporation, Tulsa, Okla., under the trade designation "VYBAR® 260."

A paraffinic wax or other natural or synthetic ester of a long chain (C16 or greater) carboxylic acid and alcohol having a melting temperature of from about 60-70° C. may also be used in the thin coating.

The size and shape of the thermally conductive filler is not critical for the purposes of the present invention. In this regard, the filler may be provided in any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.01-10 mil (0.25-250 μm), but may further vary depending upon the thickness of coating 45. The filler may be loaded at between 1-80% by weight. Suitable thermally conductive fillers include boron nitride, titanium diboride, aluminum nitride, silicon carbide, graphite, a metal such as silver, aluminum and copper, a metal oxide such as aluminum oxide, magnesium oxide, zinc oxide, beryllium oxide, or antimony oxide, and mixtures thereof.

Examples of such PCMs are further described in U.S. Pat. Nos. 6,054,198, 6,835,453 and 6,946,190, each of which in incorporated herein by reference in it's entirely. Exemplary PCMs are marketed commercially under the names THERMFLOW™ T310, T443, T705, T710, T725, and A725 by the Chomerics TEC Division of Parker-Hannifin Corp. (Hudson, N.H.). Other phase-change materials are marketed commercially by the Bergquist Company (Minneapolis, Minn.) under the tradename "HI-FLOW™," by Thermagon, Inc. (Cleveland, Ohio) under the tradenames "T-PCM™" and by Orcus, Inc. (Stilwell, Kans.) under the tradename "THERMAPHASE." A phase-change material/metal foil laminate is marketed by Thermagon, Inc. under the tradename "T-MATE™."

The PCM material may be coated on the flexible graphite pad in a conventional manner such as, for example, by a direct process such as spraying, knife coating, roller coating, casting, drum coating, dipping, dispensing, extrusion, screen printing, or like, or an indirect transfer process.

The coated perforated graphite sheet, in being flexible, resilient, and compressible, is thereby able to conform to surface irregularities for lower thermal contact resistance and more efficient and faster heat transfer through the interface.

EXAMPLES

| Example | Thermal Interface | Thermal Conductivity (W/m · K) ASTM D5470 |
|---|---|---|
| Comparative A | 5 mil (dry) graphite sheet | 0.5 |
| Comparative B | 5 mil graphite sheet w/oil coating* | 1.55 |

| Example | Thermal Interface | Thermal Conductivity (W/m · K) ASTM D5470 |
|---------|-------------------|-------------------------------------------|
| Comparative C | 5 mil perforated (dry) graphite sheet | 2.25 |
| Example 1 | 5 mil perforated graphite sheet with oil coating* | 2.8 |

*500 centipoise silicone oil

Test results indicate that a thin film of oil or wax will significantly reduce the interfacial contact resistance of the interface. Additionally, test results indicated that incorporating a coarse perforation into the surface of the graphite film increased the bulk thermal properties.

Figure 5:
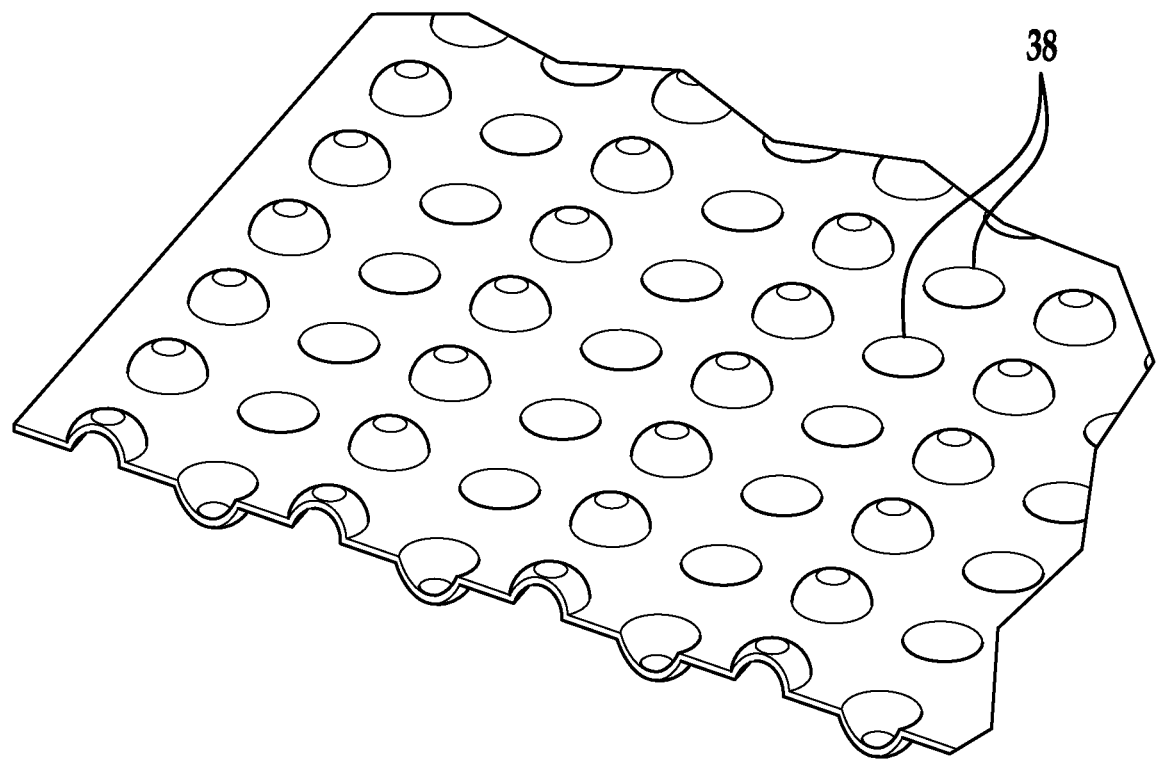
FIG. 5 is an exemplary representation of the perforated thermal interface pad having coarse perforations therein.

FIG. 5 shows a perforated graphite sheet that is flexible and conformable and suitable for use as a thermal interface material.

Advantageously, the thermal interface of the present invention is conformable for lower contact resistance and more efficient heat transfer between, for example, an electronic component and a heat sink, spreader, or other dissipation member within a thermal management assembly, but which also is cleanly releasable from the surface of the electronic component for rework, repositioning, or other disassembly. Still other advantages include a thermal interface material having a clean break capability from the electronic component which is not temperature dependent. These and other advantages will be readily apparent to those skilled in the art based upon the disclosure contained herein.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A thermally conductive interface for interposition between a heat-generating electronic component having an operating temperature range above normal room temperature and a first heat transfer surface disposable in thermal adjacency with a second heat transfer surface of a thermal dissipation member, said interface comprising:
a heat spreading material formed of a flexible, lamellar graphite material consisting essentially of intercalated graphite flake in the form of a graphite sheet having a first major surface and a second major surface, the graphite sheet having a plurality of coarse perforations therein; and
a coating of a thermally-conductive phase change material on at least one of the first and second major surfaces of the graphite sheet, the coating having a thickness of less than 0.5 mil.

2. The interface of claim 1, wherein the phase change material comprises an admixture of a polymeric component and one or more thermally conductive fillers.

3. The interface of claim 2, wherein the one or more thermally conductive fillers is chosen from among boron nitride, titanium diboride, aluminum nitride, silicon carbide, graphite, metals, metals oxide, and mixtures thereof.

4. The interface of claim 2, wherein the polymeric component comprises one or more resins, one or more waxes, or a blend of one or more waxes and one or more resins.

5. The interface of claim 4, wherein the resins or waxes are selected from among thermoplastics, paraffinic waxes and blends thereof.

6. The interface of claim 1, wherein the thermal dissipation member is a heat sink or a circuit board.

7. A thermal management assembly comprising:
a first heat transfer surface;
a second heat transfer surface opposing the first heat transfer surface; and
a thermally conductive interface interposed intermediate the first heat transfer surface and second heat transfer surface to provide a thermally conductive pathway therebetween, said interface having a first interface surface disposed in heat transfer contact with said first heat transfer surface and an opposing second interface surface disposed in heat transfer contact with said second heat transfer surface, said interface comprising:
a heat spreading material formed of a flexible, lamellar graphite material consisting essentially of intercalated graphite flake in the form of a graphite sheet having a first interior surface and a first exterior surface defining said first interface surface of said interface, the graphite sheet having a plurality of coarse perforations therein; and
a coating of a thermally-conductive phase change material having a second interior surface joined to the first interior surface of the of the graphite sheet, the coating having a thickness of less than 0.5 mil.

8. The thermal management assembly of claim 7, wherein the phase change material comprises an admixture of a polymeric component and one or more thermally conductive fillers.

9. The thermal management assembly of claim 8, wherein the one or more thermally conductive fillers is chosen from among boron nitride, titanium diboride, aluminum nitride, silicon carbide, graphite, metals, metals oxide, and mixtures thereof.

10. The thermal management assembly of claim 8, wherein the polymeric component comprises one or more resins, one or more waxes, or a blend of one or more waxes and one or more resins.

11. The thermal management assembly of claim 10, wherein the resins or waxes are selected from among thermoplastics, paraffinic waxes and blends thereof.

12. A method of conductively cooling a heat-generating electronic component having an operating temperature range above normal room temperature and a first heat transfer surface disposable in thermal adjacency with a second heat transfer surface of a thermal dissipation member to define an interface therebetween, said method comprising the steps of:
(a) providing a thermally conductive flexible material to substantially fill said interface, said flexible material comprising a flexible, lamellar graphite material consisting essentially of intercalated graphite flake in the form of a graphite sheet having a first major surface and a second major surface, the graphite sheet having a plurality of coarse perforations therein; and a coating of a thermally-conductive phase change material on at least one of the first and second major surfaces of the graphite sheet, the coating having a thickness of less than 0.5 mil, wherein the phase change material has a transition temperature from a first phase to a second phase within the operating temperature range of said electronic component, and said material comprising at least one resin or wax component blended with at least one thermally-conductive filler;

(b) applying said flexible material to one of said heat transfer surfaces;

(c) disposing said heat transfer surfaces in thermal adjacency to define said interface; and (d) energizing said electronic component effective to heat said coating to a temperature which is above said phase transition temperature.

13. The method of claim 12, wherein the at least one thermally conductive filler is chosen from among boron nitride, titanium diboride, aluminum nitride, silicon carbide, graphite, metals, metals oxide, and mixtures thereof.

14. The method of claim 12, wherein the resins or waxes are selected from among thermoplastics, paraffinic waxes and blends thereof.

15. The method of claim 12, wherein the thermal dissipation member is a heat sink or a circuit board.

* * * * *